United States Patent [19]

Lohstroh

[11] 4,254,427
[45] Mar. 3, 1981

[54] SEMICONDUCTOR DEVICE HAVING A COMPACT READ-ONLY MEMORY

[75] Inventor: Jan Lohstroh, Eindhoven, Netherlands

[73] Assignee: U.S. Philips Corporation, New York, N.Y.

[21] Appl. No.: 8,138

[22] Filed: Jan. 31, 1979

[30] Foreign Application Priority Data

Feb. 10, 1978 [NL] Netherlands ........................ 7801532

[51] Int. Cl.³ .................... H01L 29/90; H01L 29/56; H01L 27/10; H01L 29/04
[52] U.S. Cl. ........................................ 357/13; 357/15; 357/45; 357/59; 307/238; 365/105; 365/175
[58] Field of Search ............................ 357/13, 15, 45; 365/105, 175; 307/238

[56] References Cited

U.S. PATENT DOCUMENTS 4,163,985  8/1979  Schuermeyer et al. ............... 357/13

Primary Examiner—Gene M. Munson
Attorney, Agent, or Firm—Thomas A. Briody; Robert T. Mayer; Steven R. Biren

[57] ABSTRACT

A read-only memory in which each memory cell is formed by two back-to-back diodes across which a connection can be formed by means of punch-through. Since cross-talk between adjacent cells is impossible, the packing density may be very large. Additionally, the cycle time of the memory is low due to the very short reverse recovery time of the invented structure.

7 Claims, 6 Drawing Figures

SEMICONDUCTOR DEVICE HAVING A COMPACT READ-ONLY MEMORY

The invention relates to a semiconductor device having a read-only memory, comprising a semiconductor body having a surface-adjoining surface region mainly of one conductivity type in which a number of juxtaposed substantially parallel strip-shaped zones of the second conductivity type are present, the surface being covered with an insulating layer on which a number of juxtaposed mutually substantially parallel strip-shaped conductor tracks are provided crossing said zones, in which the conductor tracks at the area of the crossings can be connected electrically to the strip-shaped zones via windows in the insulating layer.

Read-only memories are generally known and are often referred to the literature by the abbreviation ROM. The strip-shaped zones in the semiconductor body and the conductor tracks provided on the semiconductor body constitute a cross bar system of address lines and read lines for selecting and reading, respectively, the memory sites at the crossings. The information (logic 1 and 0) corresponds to the presence or absence (or conversely) of a connection at the area of the crossings between the address lines.

In principle, resistance elements between the address lines and read lines could be used for the connections. In practice, however, nonlinear elements, for example diodes or transistors, are preferred to obtain good discrimination between selected and nonselected lines.

For a rapid operation of the device the elements used should usually show short reverse recovery times, that is to say reverse recovery times which are smaller than, for example, the overall RC time constant of the cross bar system.

In order to prevent injected minority charge carriers from diffusing from selected to nonselected cells, separation zones between adjacent cells are usually required when conventional nonlinear elements are used. These zones require extra space and aligning tolerances so that the minimum dimensions of the cell which can be obtained are rather large. As a result of this, the packing density usually is comparatively rather small in relation to the space which is occupied by the cells. In the article by J. F. Gunn et al entitled "A bipolar 16k ROM Utilizing Schottky Diode Cells" and published in I.E.E.E. International Solid State Circuits Conference, 1977, pp. 118/119, a ROM is described in which Schottky diodes (metal-to-semiconductor junctions) are used as connection elements. The strip-shaped surface zones provided in the semiconductor body and termed bit lines consist of three sub-zones, namely a comparatively low-doped central zone which forms the Schottky junctions with the metal tracks (word lines) and two comparatively highly doped zones on either side of the central zone. This structure is integrated comparatively compactly, as is usually desired.

In this known device, the highly doped zones which are situated on either side of the central zone which mainly determine the resistances of the bit lines and are separated laterally from the Schottky junction occupy comparatively much space, at least in comparison with the (imaginary) case in which said highly doped zones would coincide with the central zone. Such an imaginary configuration, however, is not possible, because usually good and reliable Schottky junctions can be formed only on comparatively high-ohmic material. Ohmic (that is nonrectifying) contacts can substantially only be obtained on low-ohmic material.

One of the objects of the invention is to provide a read-only semiconductor memory of particularly compact construction and in which the manufacturing steps are preferably compatible with those of circuit elements, such as transistors, of conventional integrated circuits so that said circuit elements can be accommodated in the same semiconductor body.

The invention is based inter alia on the recognition of the fact that diffusion of injected minority charge carriers from a selected cell to adjacent nonselected cells can be prevented if an electric draft field is present in the semiconductor body between the strip-shaped zones and the strip-shaped conductor tracks on the surface of the semiconductor body, under the influence of which field the injected charge carriers within the semiconductor body can flow mainly only to the strip-shaped conductor tracks. The invention is further based on the recognition of the fact that such drift fields can be obtained by means of the so-called punch-through effect of two oppositely located rectifying junctions of which one can be biased in the forward direction by means of the electric field of the other junction which is reversely biased.

A semiconductor device of the above-described kind is characterized according to the invention in that the strip-shaped zones are situated at a distance from the said windows and are separated therefrom by intermediate parts of the said surface region of the first conductivity type forming with the strip-shaped zones a p-n junction, hereinafter terminated first (p-n) junction, and that at the area of the windows the conductor tracks are connected to regions forming a rectifying junction, termed second junction, with the said intermediate parts of the surface region of the first conductivity type, the said rectifying junctions being separated from the said first p-n junctions by the intermediate parts of the surface region, the distance between the first p-n junctions and the associated second rectifying junctions and the doping concentration of the intermediate parts being so small that by reversely biasing at least one of the said junctions, connections can be formed by punch-through between the conductor tracks and the strip-shaped zones. As a result of punch-through between said two rectifying junctions arranged back-to-back, only those parts of the rectifying junctions can be biased in the forward direction during operation which are situated near the electric field of the depletion region associated with the said rectifying junctions which are reversely biased. As a result of this the injected minority charge carriers are drained directly via the drift field between the junctions without being capable of diffusing to adjacent cells. As a result of this no separate separation zones are necessary between the cells to prevent crosstalk between the cells so that a very compact construction is possible. Since no charge storage in the elements takes place, the reverse recovery times of each element are very short and do not influence, or influence only slightly, the cycle time of the device.

An important preferred embodiment which has special advantages both as regards the dimensions of the device and as regards the manufacture thereof is characterized in that the strip-shaped zones are formed by zones which are buried in the semiconductor body and, viewed on the surface, extend in the semiconductor body below the windows in the insulating layer. See, for example, FIGS. 3 and 4.

In this embodiment the semiconductor body may be formed by a substrate of the first conductivity type having an epitaxial layer of the first conductivity type grown thereon, the buried zones of the second conductivity type being provided at the interface between the epitaxial layer and the substrate. Since the thickness of the epitaxial layer substantially determines the value of the punch-through voltage between the rectifying junctions, and the thickness of the epitaxial layer can generally be kept rather constant throughout the surface of the semiconductor body, the spreading in the punch-through voltages throughout the matrix can be kept rather low, at least lower than when the distance between the rectifying junctions would be determined by a mask in those cases in which the strip-shaped zones would be formed entirely by surface zones.

The rectifying junctions between the conductor tracks and the surface region of the first conductivity type may be formed by metal-to-semiconductor junctions or Schottky junctions. A preferred embodiment which inter alia has the advantage that the manufacture of the device generally is simpler (while using standard technology) than when using such Schottky junctions is characterized in that the regions which are connected to the conductor tracks and which form the second rectifying junction with the said intermediate parts of the surface region comprise semiconductor zones of the second conductivity type which form a p-n junction (termed second p-n junction) with the intermediate parts of the surface region. See, for example, FIGS. 3 and 4.

These semiconductor zones may form part of the conductor tracks which may be provided in the form of layers of polycrystalline semiconductor material of the said second conductivity type which are deposited on the insulating layer and, via the windows in the insulating layer, form p-n junctions with the surface region of the first conductivity type, as shown, for example, in FIG. 6.

A preferred embodiment is characterized in that the said semiconductor zones are formed by surface zones of the second conductivity type which are provided in the surface region at the area of the windows in the insulating layer. See, for example, FIGS. 3 and 4. In this embodiment the conductor tracks may be formed by layers of a suitable metal, for example aluminum, so that lines having lower resistance values can be obtained than when polycrystalline conductor tracks are used.

An embodiment of a device according to a further aspect of the invention is characterized in that means are present by which a voltage in the reverse direction can be applied to one of the first and the second junctions in a cell of the memory device to be selected and/or to be read so that—dependent on the information—punch-through from the said rectifying junction to the other rectifying junction can occur and hence a connection can be formed between the strip-shaped zone associated with the cell and the conductor track. A preferred embodiment in which, as will become apparent from the description of the figures, an arbitrary selection of cells is possible is characterized in that means are present by which a voltage in the reverse direction can be applied to the said other junction of nonselected cells, which voltage is smaller than the voltage at which punch-through occurs from the other junction to the first junction and by means of which upon selecting a given cell the said voltage across the other junction can be reduced in comparison with the voltage across the other junction in nonselected cells. Selection and read circuits in accordance with the invention may incorporate transistors integrated with the memory device, as shown in FIG. 5.

The invention will be described in greater detail with reference to various embodiments and the accompanying drawing, in which.

It is to be noted that the figures are diagrammatic and are not drawn to scale.

Figure 1:
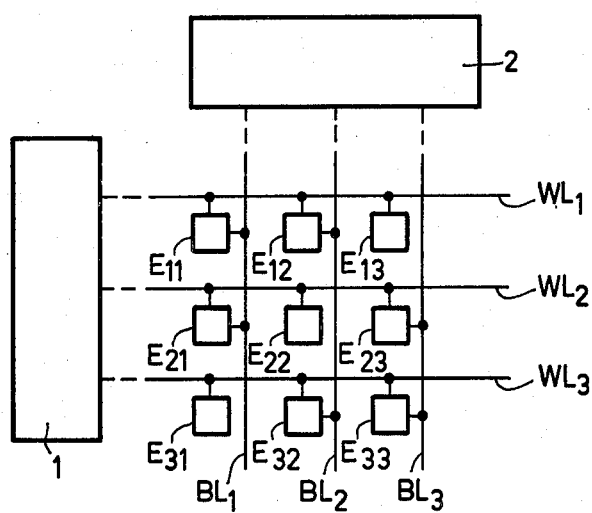
FIG. 1 shows diagrammatically a part of a matrix of a memory device of the type to which the invention relates.

FIG. 1 shows a diagram of a part of a read-only memory, hereinafter referred to as a ROM. The device comprises a set of vertical and horizontal address lines crossing each other. The vertical lines have reference characters $BL_1$–$BL_3$ (bit lines); the horizontal lines having the reference characters $WL_1$ . . . $WL_3$, are usually termed word lines because the memory cells are usually organized in words. Other forms of organization, for example that in which each cell can be selected individually, are also possible, of course. The word lines WL and the bit lines BL are connected to selection circuits 1 and read circuits 2, respectively. These circuits do not form part of the invention and may be of any conventional type.

The memory sites are formed by a set of connection elements arranged in rows and columns at the area of the crossings of the word lines and bit lines. Dependent on the place in the matrix structure, said elements in FIG. 1 are provided with the symbols Exy, where the index x indicates the place of the element in a row, while y indicates the place in a column. The information (logic "1" and "0" or conversely) is represented by the presence of absence of the connection by means of such an element between the word lines and bit lines at the area of the crossings. The embodiments to be described relate to cases in which at the area of each crossing an element E is present which, dependent on the information, is connected or is not connected to at least one of the word lines and bit lines, for example, connected or not connected to the word lines. As shown in FIG. 1, for example, the elements $E_{13}$, $E_{22}$ and $E_{31}$ are not connected to the bit lines BL, all the other elements on the contrary are connected to said lines. It will be obvious that the elements $E_{13}$, $E_{22}$ and $E_{31}$ may also be omitted entirely, if desired.

The device can be operated in a usual manner: By means of the selection circuit 1, a suitable voltage can be applied to the word lines WL to be selected, which voltage differs from the voltage which is applied to the other nonselected word lines. Dependent on the stored or written information at the crossings of said selected word line to the bit lines, current will or will not be passed through the associated elements Exy, in which said information can be read at the bit lines.

The matrix or part thereof shown in FIG. 1 comprises 3×3 memory elements. In practical embodiments the number of memory sites generally is much larger and may be several thousands of elements. In connection with this very large number it is generally of importance to minimize the dimensions of the memory elements E themselves so as to thus maintain the overall dimensions of the semiconductor device within acceptable limits. In addition it is of great importance that the elements E should also be rapid, that is to say, can be switched in a short time from the on-state to the off-state and vice versa.

Figure 2:
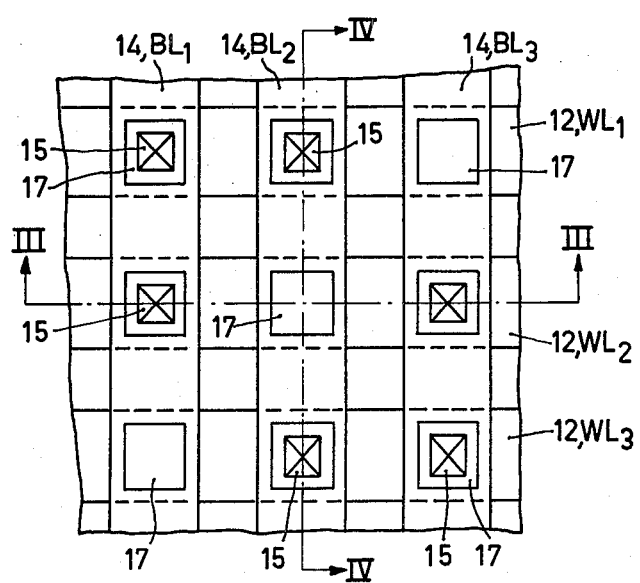
FIG. 2 is a plan view of a part of such a device according to the invention.

A first embodiment of a semiconductor device according to the invention will now be described with reference to FIGS. 2 to 4, FIG. 2 being a plan view of a matrix of 3×3 elements as shown in FIG. 1.

The device comprises a semiconductor body 10 of a suitable semiconductor material, for example silicon, having at least a surface region of a given first conductivity type adjoining the surface 11. In the present case the surface region which is of the p-type covers the whole semiconductor body 10 and will therefore be referred to hereinafter as the semiconductor body. A number of juxtaposed, mutually substantially parallel-extending strip-shaped n-type zones 12 in the body 10 correspond to the word lines in FIG. 1 and are therefore provided with the reference characters $WL_1-WL_3$. It is to be noted that the functions of word lines and bit lines may also be interchanged, in which case the buried zones 12 form the bit lines and the conductor tracks 14 form the word lines. Such a configuration will be of advantage in particular when the series resistance in the word lines is low due to the value of the electric currents in the word lines which may be much larger than the currents in the bit lines.

The surface 11 is covered with an insulating layer 13 of silicon oxide or other suitable dielectric, for example silicon nitride, aluminium oxide or combinations of such materials. A number of juxtaposed, mutually substantially parallel-extending conductor tracks 14 crossing the n-type zones 12 are provided on the insulating layer 13. Said tracks correspond to the bit lines in FIG. 1 and are therefore provided with the reference characters $BL_1 \ldots BL_3$. Dependent on the information, said conductor tracks can be connected to the word lines 12 via an element having a nonlinear resistance, which will be referred to hereinafter, and via windows 15 in the insulating layer 13.

According to the invention, the word lines WL do not directly adjoin windows 13 but are separated herefrom by intermediate parts 16 of the p-type semiconductor body 10. With the said intermediate p-type parts 16 the n-type word lines each form a p-n junction, hereinafter termed first junction $J_1$. At the area of the windows 15 the conductor tracks 14 are connected to regions 17 which form a rectifying junction, termed second junction $J_2$, with the intermediate parts 16 of the p-type semiconductor body 10. The regions 17, for example, may form part of the conductor tracks themselves which, in the case in which the conductor tracks are of metal, may form a Schottky junction with the semiconductor body 10 at the area of the windows 15 and, in the case in which the conductor tracks 14 are of semiconductor material, may form a p-n junction with the semiconductor body 10. In the embodiment shown in FIGS. 2-4, however, the regions 17 are formed by n-type surface zones which form p-n junctions $J_2$ with the p-type semiconductor body. The p-n junctions $J_1$ and $J_2$ are separated from each other by the intermediate parts 16 of the semiconductor body 10. The distances between the junctions $J_1$ and $J_2$ and the doping concentration of the intermediate p-type parts of the body 10 are so small that at least in the memory sites where the bit lines are connected to an n-type zone 17 connections can be formed between the conductor tracks 14 and the n-type zones 12 by punch-through by biasing at least one of said junctions in the reverse direction.

The strip-shaped n-type zones 12, WL are formed by buried zones which, viewed on the surface 11, extend below the windows in the oxide layer 13. The zones 12 may be provided by forming n-type surface zones in a p-type substrate 18 at the area of the buried zones 12 and then depositing the p-type region 16 in the form of an epitaxial layer 19 on the substrate. The punch-through voltage, dependent on several parameters, for example, the doping and the thickness of the region 16, is determined in particular by the thickness of the epitaxial layer 19. The spreading of the punch-through voltages over all memory elements proves to be comparatively low, at least lower than in the case in which the zones 12 were also formed by surface zones separated laterally from the zones 17.

Figure 3:
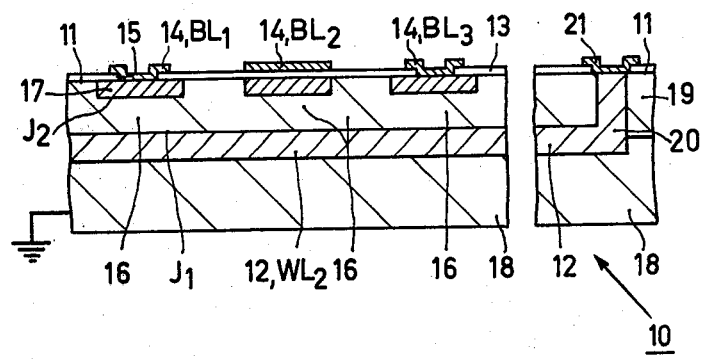
FIG. 3 is a sectional view taken on the line III—III of FIG. 2 of this device.

The buried zones 12 may be contacted in the manner as indicated in the right-hand part of FIG. 3 by means of a deep n-zone 20 extending from the surface 11 down to the buried zone 12 and having a metal contact 21.

Figure 5:
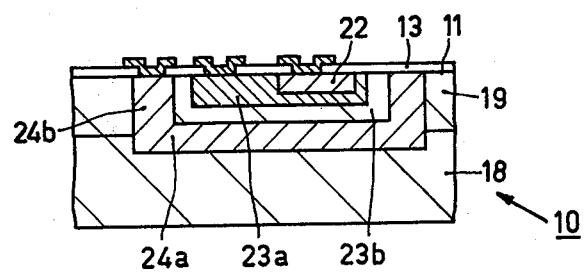
FIG. 5 shows a transistor which can be integrated with the memory device in a common semiconductor body.

The device can be manufactured entirely by means of generally known methods which need not be further described. Simultaneously with the memory elements, other elements, for example transistors, can also be provided in the semiconductor body to form of the circuits 1 and 2 shown diagrammatically in FIG. 1. FIG. 5 is a sectional view of such a transistor comprising an n-type emitter zone 22 which may be provided simultaneously with the n-zones 17, a p-type base zone 23 formed by a part of the epitaxial layer 19 which is bounded by the collector, and a cup-shaped n-type collector zone 24 comprising a buried portion 24a which can be formed simultaneously with the buried zones 12, and upright walls which can be provided simultaneously with the deep n-type zone 20.

In order to improve the transistor properties (inter alia reduction of the base resistance) the doping concentration in a portion 23a of the base around the emitter 22 and near the base contact may be increased to a suitable value. The portion of the base having the original doping concentration of the epitaxial layer 19 is indicated by reference numeral 23b.

The operation of the device will be described with reference to a specific embodiment in which the thickness of the epitaxial layer was approximately 3 $\mu$m and the resistivity approximately 10 Ohm.cm, and the thickness of the region 16 between the n-type zones 12 and 17 was approximately 2 $\mu$m. The punch-through voltage of the buried zones 12 to the surface zone 17 was approximately 3 V. The potential of the semiconductor body 10 is chosen as reference potential, for example ground. If, by way of example, the memory elements associated with the word line $WL_2$ are to be read, a voltage of 3 V, or slightly larger, is applied to said word line so that the associated p-n junction J is reversely biased. The depletion region associated herewith penetrates into the p-type regions 16 over such a distance that the p-n junctions $J_2$ situated opposite to said p-n junction J are (can be) biased in the forward direction.

In the case in which the bit lines BL are connected to the associated n-type zones via a window in the oxide layer 13, so the bit lines $BL_1$ and $BL_3$, a current can be passed via $E_{21}$ and $E_{23}$ and through said bit lines, which corresponds to a logic "1". In the case in which at the area of the crossing no window 15 is present in the oxide layer 13, for example the bit line $BL_2$, no current can be passed between the bit line $BL_2$ and word line $WL_2$, which corresponds to a logic "0".

In the manner described a whole word can be read at the same time. However, the device may alternatively be operated so that at a given instant only a single memory element is selected for reading. For this purpose, in principle a voltage of, for example, +1 V is applied to all bit lines so that the junctions $J_2$, in so far at least as they are contacted with the conductor tracks 14, are also reversely biased. The voltage which is to be applied to the buried zones 12 to produce punch-through to the surface zone 17 now is 4 Volts. In the case in which, for example, the element E 21 is to be read, the voltage of the bit line $BL_1$ is reduced (in absolute value) to approximately 0 V. When a voltage of +3 V is applied to the word line $WL_2$, punch-through can occur only at the area of the crossing between $WL_2$ and $BL_1$ and hence a conductive connection can be formed. In the same manner, for example, element $E_{22}$ may be selected and read. In this case, however, no connection can be formed between the word lines and bit lines because at the area of said crossing no window 15 is present in the oxide layer.

The electrons which are injected by the p-n junctions $J_2$ as a result of punch-through will not expand in the p-type regions as a result of diffusion but be dissipated directly via the buried n-zones 12 as a result of the electric field between the junctions $J_1$ and $J_2$. The upright parts of the p-n junctions $J_2$ which are not biased in the forward direction by punch-through fields will not inject minority charge carriers (electrons) in the p-type region 16. As a result of this, separate zones between adjacent elements which are required in many known memory devices to avoid cross-talk between said memory elements are not necessary. As a result of this the packing density of the memory device may become very large. Punch-through between adjacent buried zones can simply be prevented by choosing the distance therebetween to be slightly larger than the distance between oppositely located p-n junctions $J_1$ and $J_2$ since the punch-through voltage between two p-n junctions increases condiderably with the distance. With a width of approximately 6 μm for the buried zones 12 and the metal tracks 14 and with mutual distance between the metal tracks mutually and the buried zones mutually of approximately 6 μm, small memory cells having an average area of approximately $12 \times 12$ μm² = 144 μm² can be realized. Since the injected charge carriers are drained directly by the punch-through fields, the switching times are generally very short. In a specific embodiment reverse recovery times of smaller than 3 μs have been measured. Such short times have hardly any influence on the overall cycle time of the device.

Figure 4:
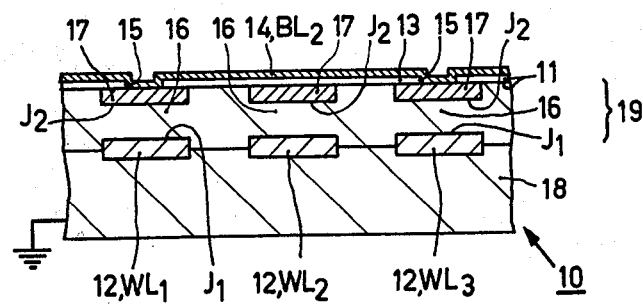
FIG. 4 is a sectional view taken on the line IV—IV of FIG. 2 of the same device.
Figure 6:
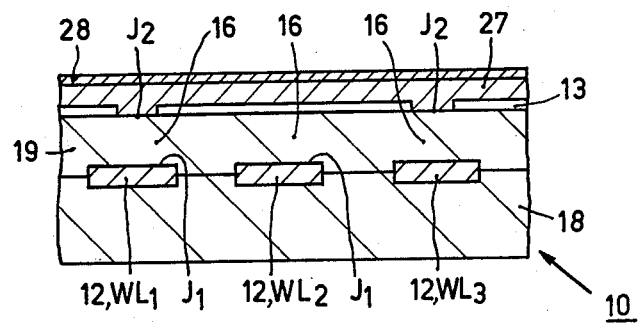
FIG. 6 shows a part of a memory device according to a second embodiment of the invention.

FIG. 6 is a cross-sectional view corresponding to the sectional view shown in FIG. 4 of an embodiment which differs slightly from the preceding embodiment. In this case the p-n junctions $J_2$ are not formed by surface zones provided in the body 10 but by the bit lines BL themselves which are at least partly provided in the form of n-type polycrystalline silicon tracks 27 which are deposited on the oxide layer 13 and, via the windows 15, form the poly-mono p-n junctions $J_2$. A metal layer 28 of, for example, Al may be provided on the polycrystalline layers 27 so as to reduce the resistance in the bit lines. This embodiment, which may require a few more process steps than the preceding embodiment, has the advantage that the spreading in punch-through voltages generally is smaller; since in fact the p-n junctions $J_2$ coincide substantially with the poly-mono junctions the spreading in the distance between the junctions $J_1$ and $J_2$ which determine the punch-through voltages to a considerable extent is also smaller.

It will be apparent that the invention is not restricted to the embodiments described but that many variations are possible to those skilled in the art without departing from the scope of this invention. For example, while maintaining the advantages in the last embodiment, the polycrystalline semiconductor layer 27 may be replaced by a metal layer which forms Schottky junctions $J_2$ via the windows 15 in the oxide layer 13.

Instead of buried zones, the zones 12 may alternatively be surface zones which are separated laterally from the windows 15.

In the embodiments described the information has been provided during the manufacture by means of the mask which defines the windows 15 in the oxide layer 13. However, programmable memories are also feasible within the scope of the invention. In this case, for example, fuses may be used between the conductor tracks 14 and the zones 17.

Furthermore the invention is not restricted to the materials described here. Other materials for the body 10, the insulating layers and the conductor tracks may alternatively be used advantageously.

What is claimed is:

1. A semiconductor device having a read-only memory, which comprises:
    a semiconductor body having a surface-adjoining region substantially of a first type conductivity;
    a plurality of juxtaposed mutually substantially parallel strip-shaped zones of a second type conductivity opposite to that of the first and in the surface-adjoining region;
    an insulating layer on the surface of said surface-adjoining region;
    a plurality of juxtaposed, mutually substantially parallel strip-shaped conductor tracks on the insulating layer, and crossing the strip-shaped zones;
    at least one window in said insulating layer, through which a selected conductor track can be electrically coupled to a selected strip-shaped zone crossing the conductor track, the strip-shaped zones being spaced apart from each said window and separated therefrom by an intermediate part of the surface-adjoining region, said intermediate part and said strip-shaped zones forming a plurality of first p-n junctions; and
    a region at the area of each window in said insulating layer and connected to a conductor track, each said region forming a second, rectifying junction with said intermediate part of the surface-adjoining region, each said second junction being separated from said first junctions by said intermediate part of the surface-adjoining region, and the doping concentration of said intermediate part and the distance between said first and second junctions each being sufficiently small such that connections can be formed by punch-through between at least one crossing track and strip-shaped zone by reversely biasing at least one of said junctions.

2. A semiconductor device as claimed in claim 1, characterized in that the strip-shaped zones are formed by zones which are buried in the semiconductor body and which, viewed on the surface, extend in the semiconductor body below the windows in the insulating layer.

3. A semiconductor device as claimed in claim 2, characterized in that the semiconductor body comprises a substrate of the first conductivity type having an epitaxial layer of the first conductivity type grown thereon, the buried zones of the second conductivity type being situated at the interface between the epitaxial layer and the substrate.

4. A semiconductor device as claimed in claim 1, characterized in that each region which is connected to a conductor track and which forms with said intermediate part of the surface region the second rectifying junction comprises a semiconductor zone of the second conductivity type which forms said second junction with the intermediate part of the surface region.

5. A semiconductor device as claimed in claim 4, characterized in that each said semiconductor zone is formed by a surface zone of the second conductivity type which is provided in the surface region at the area of each window in the insulating layer.

6. A semiconductor device as claimed in claim 1, further comprising means for applying a voltage in the reverse direction across one of the first and the second junctions in a cell of the memory device so that punch-through from said one junction to the other junction can occur and a connection can be formed between the strip-shaped zone associated with the cell and the associated conductor track.

7. A semiconductor device as claimed in claim 6, characterized in that means are present by which at said other junction of nonselected cells a voltage in the reverse direction can be applied across the other junction which is smaller than the voltage at which punch-through occurs from other junction to the first junction and by means of which upon selecting a given cell the said voltage across the other junction can be reduced in comparison with the voltage across the other junction in nonselected cells.

* * * * *

UNITED STATES PATENT AND TRADEMARK OFFICE
CERTIFICATE OF CORRECTION

PATENT NO. : 4,254,427
DATED : March 3, 1981
INVENTOR(S) : Jan Lohstroh

It is certified that error appears in the above—identified patent and that said Letters Patent is hereby corrected as shown below:

Claim 7, line 6, after "from" insert --the--

Claim 7, line 7, delete "the"

Signed and Sealed this

Third Day of May 1983

[SEAL]

Attest:

GERALD J. MOSSINGHOFF

Attesting Officer

Commissioner of Patents and Trademarks